United States Patent [19]
Karam et al.

[11] Patent Number: 5,113,414
[45] Date of Patent: May 12, 1992

[54] PREDISTORTION ARRANGEMENT FOR A DIGITAL TRANSMISSION SYSTEM

[75] Inventors: Georges Karam; Saïd Moridi, both of Paris, France

[73] Assignee: U.S. Philips Corporation, New York, N.Y.

[21] Appl. No.: 595,346

[22] Filed: Oct. 9, 1990

[30] Foreign Application Priority Data

Oct. 6, 1989 [FR] France ................. 89 13092

[51] Int. Cl.$^5$ .............. H04K 1/02; H04L 25/03
[52] U.S. Cl. .................... 375/60; 330/149; 332/107
[58] Field of Search .............. 375/39, 59, 60; 330/149; 332/107, 123, 124, 160, 176; 455/108, 126

[56] References Cited

U.S. PATENT DOCUMENTS

| | | | |
|---|---|---|---|
| 4,291,277 | 9/1981 | Davis et al. | 330/149 |
| 4,430,651 | 2/1984 | Bryant et al. | 370/94.1 |
| 4,462,001 | 7/1984 | Girard | 375/60 |
| 4,554,514 | 11/1985 | Whartenby et al. | 455/296 |
| 4,675,618 | 6/1987 | Cross | 232/124 |
| 4,700,151 | 10/1987 | Nagata | 330/149 |
| 4,908,840 | 3/1990 | Kakimoto | 375/60 |

*Primary Examiner*—Stephen Chin
*Attorney, Agent, or Firm*—David R. Treacy

[57] ABSTRACT

A predistortion arrangement (9) for a digital transmission system transmits complex input data of a constellation by means of a modulator (14) and a power amplifier (15) which distorts the data. The arrangement comprising a predistortion circuit (11) which predistorts the input data in opposite sense before they pass through the amplifier and a transmit filter (10) which applies oversampled filtered data encoded with 2N bits to the predistortion circuit (11) at the rate k/T. The predistortion circuit (11) is formed from an encoder (20) transforming the filtered 2N-bit encoded data into data encoded with 2M bits (M<N) which address a memory (51) that stores complex predistortion coefficients, and a complex multiplier (52) that multiplies for each data element the 2N bits of the filtered data element by the selected predistortion coefficient for producing predistorted data.

12 Claims, 5 Drawing Sheets

PREDISTORTION ARRANGEMENT FOR A DIGITAL TRANSMISSION SYSTEM

RELATED APPLICATIONS

This application is related in subject matter to the following commonly owned U.S. patent applications: Ser. No. 407,380, filed Sep. 14, 1990; Ser. No. 462,662 filed Jan. 9, 1990; Ser. No. 494,088, filed Mar. 14, 1990; and an application filed concurrently herewith, inventors Georges Karam and Hikmet Sari, entitled "Predistortion Arrangement For A Digital Transmission System".

BACKGROUND OF THE INVENTION

1. Field of the Invention

The invention relates to a predistortion arrangement for a digital transmission system which transmits complex input data at the rate of a symbol clock H having a period T, with the aid of a modulator and a power amplifier which distorts the data, the arrangement comprising a predistortion circuit predistorting in opposite sense the input data before they pass through the amplifier in order to transmit the expected input data. The invention finds its applications in digital transmission systems such as data transmission modems, microwave links, space communications systems.

2. Description of the Related Art

For an efficient use of the available spectrum, the current digital transmission systems, more specifically, the microwave radio relay links and systems for data transmission over the telephone channel, use multilevel phase and amplitude modulation methods. These modulation methods are very sensitive to all sorts of distortion and, more specifically, to non-linear distortions from amplifiers, mixers and other non-linear circuits in the transmission chain. A particularly critical point with respect to microwave radio relay links and satellite transmission is the non-linearity of the send power amplifier or of the power amplifier on board in the case of satellite transmission. These amplifiers are known for their non-linear characteristics. If they are used in their linear zones their power is not utilized to full extent. If they are allowed to operate close to their saturation power levels, they will distort the signal in an unacceptable manner. In practice, with a given power amplifier, the level of the transmitted signal is fixed in order to realize a compromise between the signal-to-noise ratio and the non-linear distortion which the signal has undergone. Thus, the optimum operating point of the amplifier is that at which the joint effects of the additive noise of the channel and the non-linear distortion of the amplifier are minimized. For multilevel modulations (64-QAM and 256-QAM, for example) this point is remote from the saturation power of the amplifier, which means that the amplifier is not used in an efficient way. In order to augment its efficiency, predistortion techniques (fixed or adaptive) are currently used with which it is possible to reduce the effect the non-linearity of the power amplifier has on the transmitted signal.

A predistortion technique currently used consists of inserting into the intermediate-frequency stage of the transmitter a non-linear circuit approaching the inverse function of the power amplifier whose non-linearities are intended to be compensated. If the exact inverse of the function of the amplifier could be synthesized, this technique would make it possible to have a perfect output signal (without any non-linear distortion). However, this cannot be realized because a circuit of infinite complexity would be necessary for the exact inverse. In practice, it is sufficient to make an approximation and more often than not the Taylor series representing the non-linear function of the amplifier is restricted to the third order and a predistortion circuit is synthesized, also of the third order, so that the two cascaded circuits no longer have a third order distortion. Terms of higher order (5th and 7th order) appear at the output but have a low amplitude compared to the initial third order distortion. As a result, there is a certain improvement of the system performance. A disadvantage of these predistortion circuits in the intermediate frequency stage resides in the fact that they are analog circuits. They are hard to render adaptive and require intermittent interventions to readjust them and compensate for the time and temperature variations of the amplifier response. This predistortion technique is furthermore to be excluded if one wishes to have an automatic send power control.

Another more recent predistortion technique consists of modifying the alphabet of the data to be transmitted. This technique termed "data predistortion" or "baseband predistortion" is known from U.S. Pat. No. 4,291,277 as well as the article by A. A. M. SALEH and J. SALZ entitled "Adaptive Linearization of Power Amplifiers in Digital Radio Systems", Bell System Technical Journal, Vol. 62, April 1983, pp. 1019-1033.

In the article by A. A. M. SALEH and J. SALZ, FIG. 1 is a diagram of an adaptive predistortion circuit which produces a distorted constellation at the input of the modulator on the basis of the original square constellation, for example that of an amplitude modulation of two quadrature carriers (QAM). The amplifier affects the constellation by producing a net compression and a net rotation of the points having a large amplitude. In order to compensate for this effect the original constellation is distorted so that it resumes its original square form after passing through the power amplifier. Thus, when the predistortion circuit is optimized, it forms the reverse of the power amplifier (apart from gain and phase) and permits perfect compensation for the non-linearities of the amplifier. In order to make this circuit adaptive, the signal is taken off at the output of the amplifier, demodulated, then sampled at the transmit rate of the symbols 1/T and these samples are compared to the corresponding points of the QAM constellation used. These comparisons make it possible to obtain a control signal allowing of optimizing the predistortion circuit with the aid of a conventional algorithm. However, the diagram used in this FIG. 1 is very simplistic because it does not have any filtering before the modulator, or before the power amplifier. Thus it does not correspond to the solution generally used. In effect, in present systems one always uses a spectral shaping filter of the Nyquist type which makes it possible to limit the bandwidth of the signal while guaranteeing zero intersymbol interference at the decision instants. This filtering is generally equally divided between the transmitter and the receiver in order to maximize the signal-to-noise ratio at the decision instants. In systems of this type, the effect of the non-linearity of the amplifier is twofold: the constellation is not only deformed but intersymbol interference appears which associates a cloud of points to each point of the constellation. But the predistortion technique described hereinbefore does not make it possible to compensate this second effect.

SUMMARY OF THE INVENTION

The problem posed is thus to realize a predistortion circuit which makes it possible not only to correct the constellation but also considerably reduce the dispersing of each point of the original constellation into a cloud of points.

This object has to be achieved by maximizing the reduction of the complexity and the quantity of the required material.

The solution to this problem consists of the fact that the predistortion arrangement comprises a transmit filter which applies filtered, oversampled data encoded with 2N bits (N bits per channel) to the predistortion circuit at the rate k/T (where k is an integer greater than 1) in response to the input data, which predistortion circuit includes:

- an encoder transforming the filtered data encoded with 2N bits into data encoded with 2M bits (M<N),
- a memory addressed by the 2M bits which stores $2^{2M}$ complex predistortion coefficients,
- a complex multiplier multiplying for each data element the 2N bits of the filtered data element by the selected predistortion coefficient for producing predistorted data ($F_I$, $F_Q$).

The transmit filter performs a spectral shaping which is completed by a filtering at the receive end so that the total transmit-receive filtering is a Nyquist filter thus permitting to guarantee zero intersymbol interference at the decision instants. For diminishing the size of the clouds of points it is necessary to make a correction with more than one sample per symbol period T.

Thus, determining in a cascade manner approximate predistorted data and then the revised data advantageously requires only a reduced amount of material compared to determining the data with the aid of whole fields of 2N bits. This is particularly significant when the predistortion circuit utilizes a memory. When operating according to the invention, the size of the memory is diminished considerably.

The encoder may select the 2M most significant bits from the 2N bits of the filtered data.

But the function performed by the encoder may be more complex. Thus, for each N-bit encoded coordinate (r, q) referring to the in-phase and quadrature channels, the encoder may determine the modulus ($r^2+q^2$) and encode it with 2M bits.

The transmit filter, inserted before the encoder, which delivers the oversampled 2N-bit encoded data, may be either a digital filter or an analog filter followed by an analog-to-digital converter.

The invention will be further described for a system comprising a fixed predistortion circuit. In effect, there are situations in which the distortion mechanisms are relatively stable or for which a perfect correction is not searched. But, generally, the distortion mechanisms are susceptible to evolution and it is thus necessary to correct them continuously. In this case the predistortion circuit is adaptive and, therefore, comprises an adaptation circuit which continuously adapts the predistortion circuit in response to a comparison of input data and transmitted data by means of a demodulation of the transmitted data stream. The difference found is used to correct the predistortion coefficients which are stored in the memory and updated regularly.

BRIEF DESCRIPTION OF THE DRAWING

The invention will be better understood with the aid of the following Figures given by way of non-limiting examples and representing.

DETAILED DESCRIPTION OF THE PREFERRED EMBODIMENTS

Figure 1:
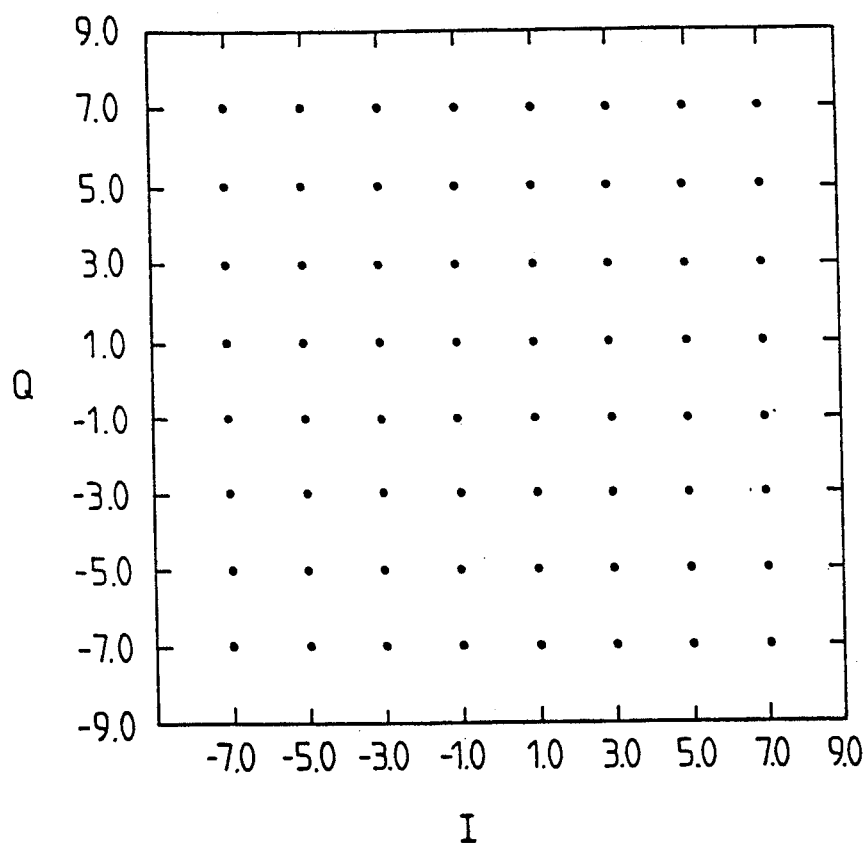
FIG. 1 the constellation of a 64-QAM modulation.

FIG. 1 is a representation of a prior-art constellation of the 64-QAM type. The inputs I (in-phase) and Q (quadrature) of the modulator are independent and the symbols on each channel take their values in an alphabet ($\pm d$, $\pm 3d$, $\pm 5d$, $\pm 7d$).

Figure 2B:
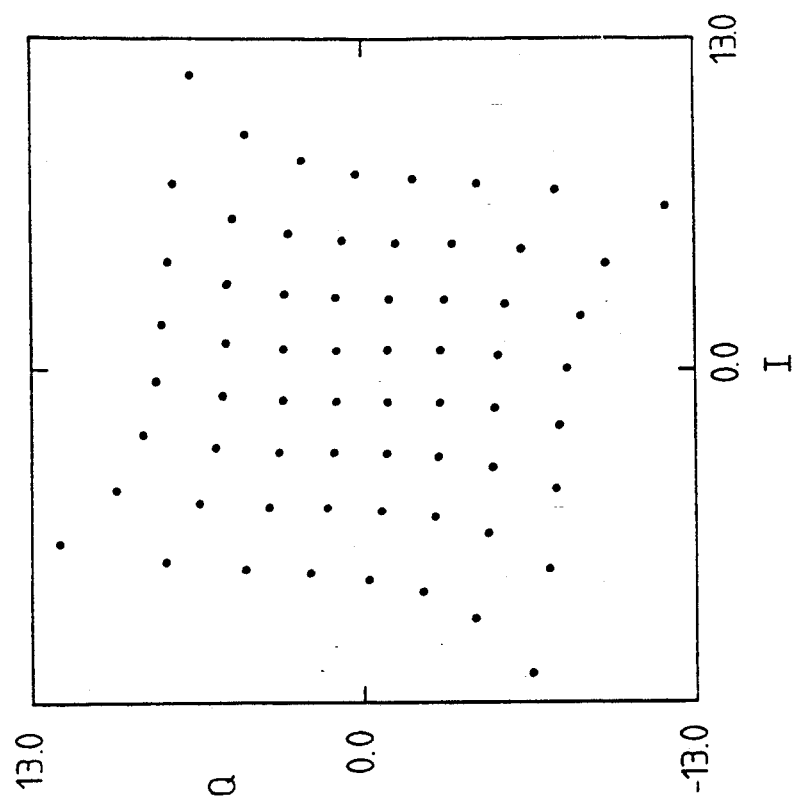
FIG. 2B an optimized predistorted constellation for the compensation of the distortion illustrated in FIG. 2A according to the prior art.
Figure 2A:
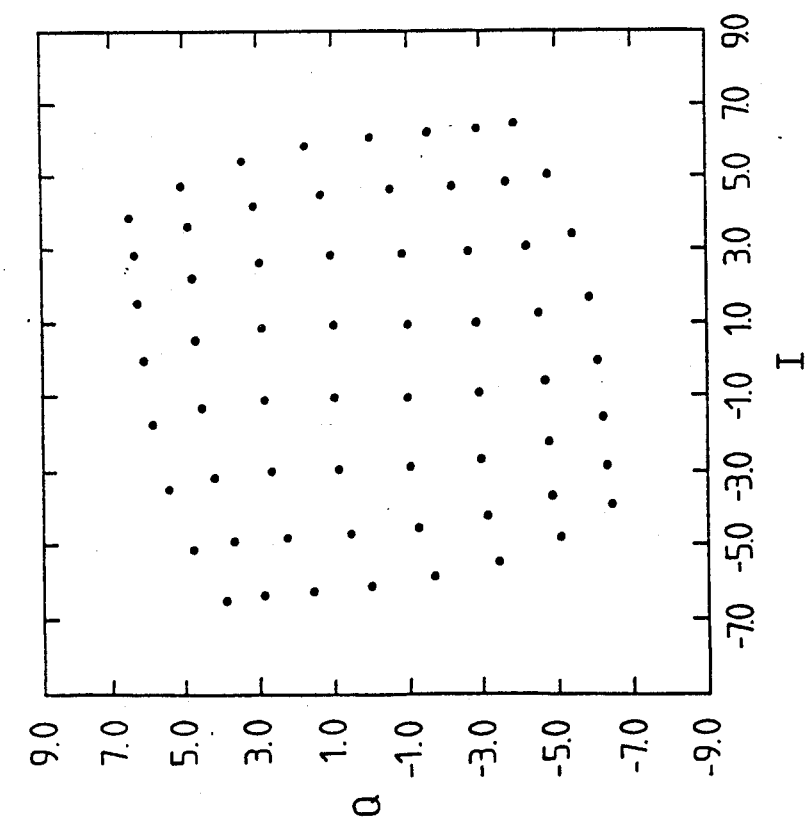
FIG. 2A a 64-QAM constellation distorted by the power amplifier in a system without a filter or in the case where all the Nyquist filtering is effected after the amplifier stage.

In order to be transmitted, the signal from the modulator is fed to a power amplifier which is generally used at reduced power, that is to say, in a linear part of its characteristic. At high power this amplifier is non-linear and distorts the signal in an unacceptable manner. If one observes a constellation of the 64-QAM type at the output of such an amplifier operating near to saturation, a distorted constellation as the one represented in FIG. 2A will be observed. According to the prior art it will then be sufficient to predistort the constellation according to the diagram of FIG. 2B in opposite sense so that the original non-deformed constellation will be obtained at the output of the amplifier. Such a simple situation is not in conformity with reality where there is always a filter before the power amplifier notably to limit the bandwidth of the signal. If there is no filter, the signal at the input of the modulator varies in steps once per symbol period T. Thus, a predistortion circuit influencing the signal at the rate 1/T makes a perfect compensation possible. In contradistinction thereto, if the signal is filtered it no longer varies in steps but in a continuous fashion. For a perfect compensation of the non-linear effect it is no longer sufficient to observe the signal once per symbol period T and compensate for the distortion at these moments.

Figure 3B:
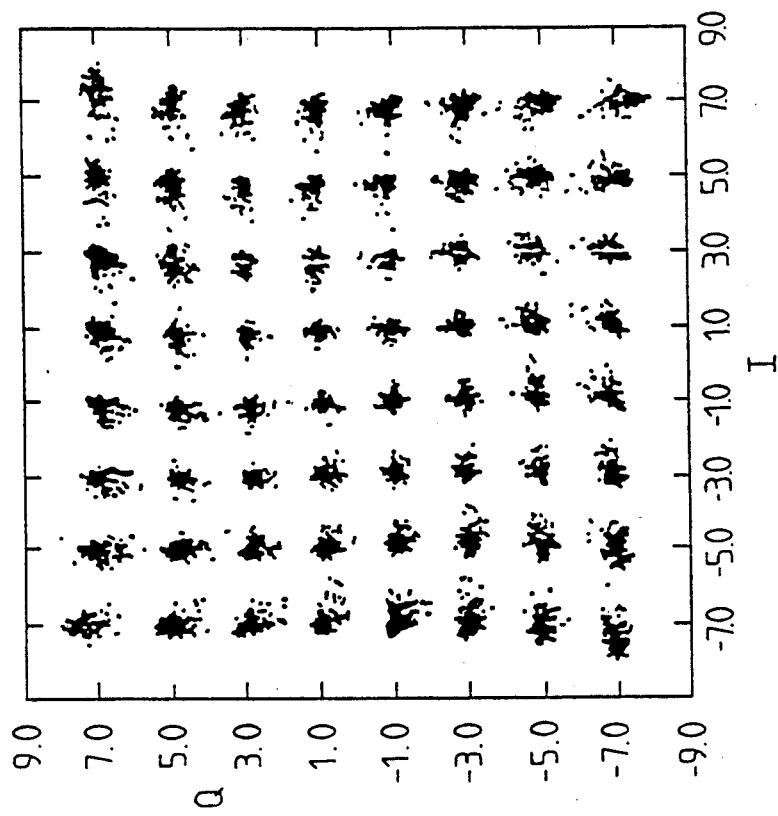
FIG. 3B the same situation as the one of FIG. 3A, but incorporating the prior-art predistortion circuit.
Figure 3A:
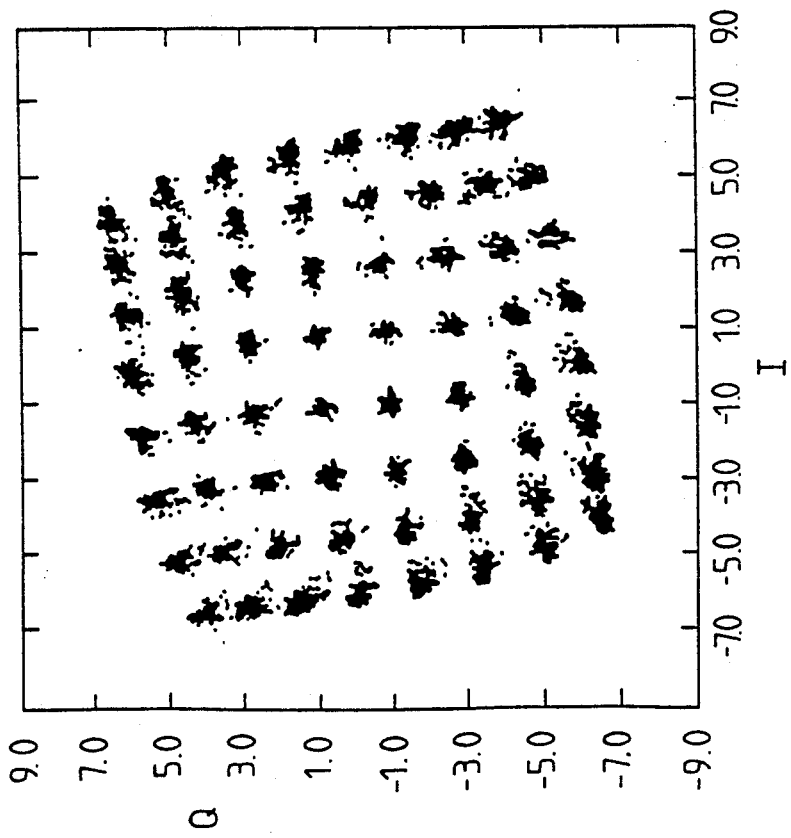
FIG. 3A the constellation distorted by the amplifier as it appears when the total filtering is equally divided between transmit and receive ends and a part of the transmit end is placed before the amplifier.

In the presence of a filtered signal the constellation at the output of the amplifier is represented in FIG. 3A. It develops into the one represented in FIG. 3B with the prior-art predistortion circuit. Thus, each point of the constellation becomes a cloud of points, which is unacceptable. In order to work with a filtered signal, one thus has to make corrections at more than one point per symbol period. Therefore, a spectral shaping of the transmission signal is effected by means of a digital filter producing at its output the filtered data at the rate k/T (k≧2). If this signal shaping is realised by an analog filter, the signal leaving the filter will be sampled at the rate k/T. In this manner, every T/k seconds one disposes of samples of the filtered signal which one can predistort.

Figure 4:
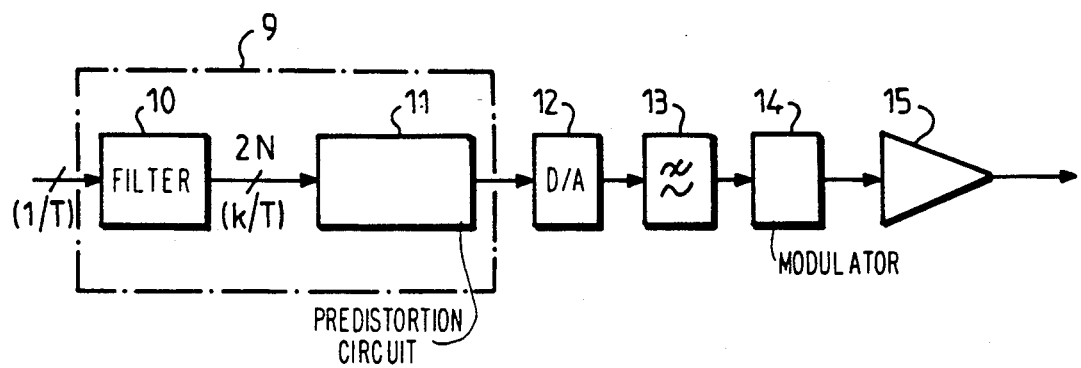
FIG. 4 a diagram of a digital transmission system according to the invention.

FIG. 4 represents a digital transmission system comprising a predistortion arrangement 9 with a transmit filter 10 producing samples, encoded in N bits, at the rate k/T (k is an integer at least equal to 2), and a predistortion circuit 11 followed by a digital-to-analog converter 12, an analog filter 13, a modulator 14 and an amplifier 15. It is this amplifier that distorts the data it is to transfer to the transmitting aerial.

Figure 5:
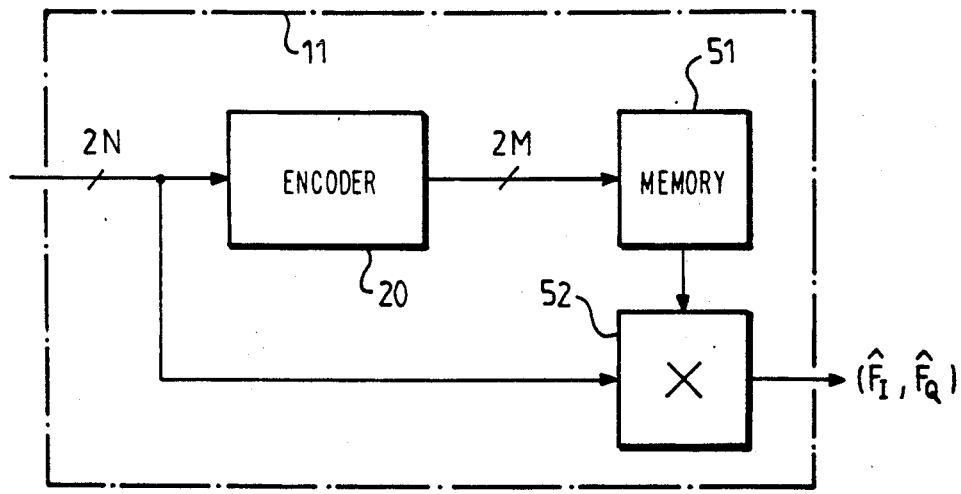
FIG. 5 a diagram of a predistortion circuit according to the invention.

FIG. 5 represents an example of a diagram of the predistortion circuit 11. It comprises an encoder 20 which reduces the 2N-bit encoding into a 2M-bit encoding. Thus, for example, for the 256-QAM modulation method the number N=10 bits may be reduced to M=4 or 5 bits. This considerably reduces the size of a memory 51 which is addressed by the 2M bits. This memory 51 stores complex predistortion coefficients which relate to each point of the constellation. These complex predistortion coefficients are used in a multiplier 52 to multiply the filtered 2N-bit encoded data. Thus, one obtains at the output the predistorted data ($F_I$, $F_Q$) which may be transmitted by the units already described in FIG. 4.

The encoder 20 may select the M most significant bits from each field of N bits of the in-phase and quadrature channels to address memory 51 with the 2M bits.

Encoder 20 may also perform a more complex function. A 2N-bit encoded data element may be represented by its coordinates r and q which relate to the in-phase and quadrature channels. The encoder 20 may thus calculate the modulus $r^2+q^2$ belonging to this data element and encode this modulus with 2M bits. This is interesting because the distortions much depend on the variations of the modulus of the points. Other functions may also be envisaged by the man skilled in the art for determining the predistortion coefficients to be applied.

Figure 6:
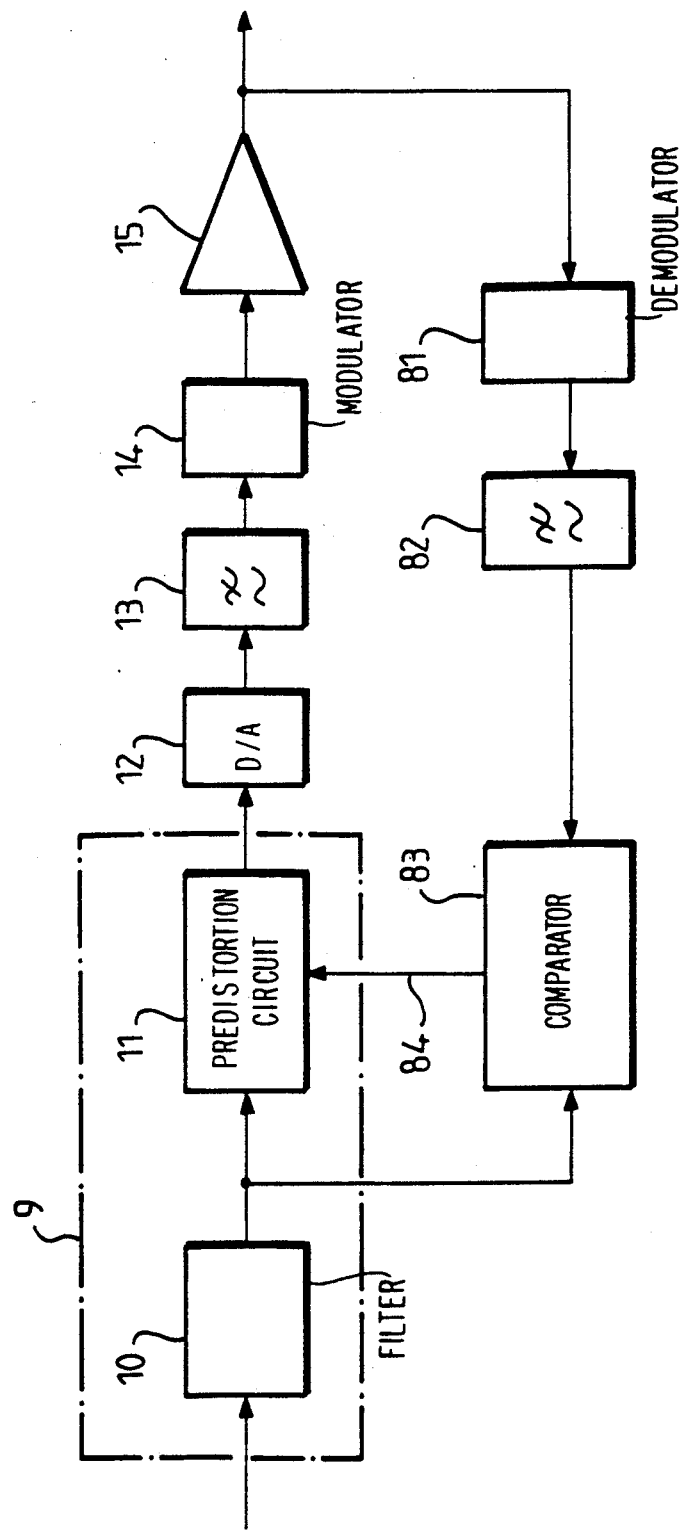
FIG. 6 a diagram of a digital transmission system comprising an adaptive predistortion circuit according to the invention.

The diagram of FIG. 4 represents a transmission system with which it is possible to predistort the data and correct the distortions introduced by the amplifier in the case of a fixed structure. But, alternatively, it is possible to realise an adaptive structure. This is represented in the diagram of FIG. 6. The same elements as those of FIG. 4 are represented having the same reference numerals. In this case the output signal of the amplifier 15 is tapped in order to be fed to a demodulator 81 followed by a low-pass filter 82 whose output signal is fed to an adaptation circuit 83. This circuit samples the output signal of the filter 82 and compares these data to the input data. The difference causes an error signal to develop which permits (connecting line 84) to update the predistortion circuit 11, for example, by storing new complex predistortion coefficients.

We claim:

1. A predistortion arrangement for a digital transmission system which transmits complex input data at a rate defined by a clock having a period T, comprising a power amplifier which introduces nonlinear distortion into data signals being transmitted, a modulator driving the power amplifier, and a predistortion circuit for predistorting input data signals in a sense opposite to distortion introduced in the power amplifier, and providing the predistorted signals to the modulator, characterized in that the predistortion circuit comprises a transmit filter means, responsive to receiving input data, for providing in-phase and quadrature channels of filtered, oversampled data encoded with 2N bits (N bits per channel), at a rate k/T, where k is an integer greater than 1, encoder means for receiving said filtered, oversampled data, and transforming the filtered data encoded with 2N bits into data encoded with 2M bits, where M<N, a memory addressed by the 2M bits, for storing $2^{2M}$ complex predistortion coefficients, a complex multiplier, for multiplying the 2N bits of each data element by a selected predistortion coefficient, to produce predistorted input data ($F_I$, $F_Q$).

2. Arrangement as claimed in claim 1, characterized in that the encoder selects the 2M most significant bits from the 2N bits of the filtered data.

3. Arrangement as claimed in claim 1, characterized in that for each 2N-bit encoded coordinate (r, q) relating to in-phase and quadrature channels, the encoder determines the modulus ($r^2+q^2$) and encodes it with 2M bits.

4. An arrangement as claimed in claim 1, characterized in that the transmit filter is either a digital filter or an analog filter having an output connected to an input of an analog-to-digital converter.

5. Arrangement as claimed in claim 1, characterized in that the predistortion circuit is adaptive and therefore comprises an adaptation circuit which continuously adapts the predistortion circuit in response to a comparison of the input data and the transmitted data, by means of a demodulation of the transmitted data stream.

6. An arrangement as claimed in claim 3, characterized in that the transmit filter is either a digital filter or an analog filter having an output connected to an input of an analog-to-digital converter.

7. Arrangement as claimed in claim 4, characterized in that the predistortion circuit is adaptive and therefore comprises an adaptation circuit which continuously adapts the predistortion circuit in response to a comparison of the input data and the transmitted data, by means of a demodulation of the transmitted data stream.

8. Arrangement as claimed in claim 2, characterized in that the predistortion circuit is adaptive and therefore comprises an adaptation circuit which continuously adapts the predistortion circuit in response to a comparison of the input data and the transmitted data, by means of a demodulation of the transmitted data stream.

9. Arrangement as claimed in claim 3, characterized in that the predistortion circuit is adaptive and therefore comprises an adaptation circuit which continuously adapts the predistortion circuit in response to a comparison of the input data and the transmitted data, by means of a demodulation of the transmitted data stream.

10. An arrangement as claimed in claim 2, characterized in that the transmit filter is either a digital filter or an analog filter having an output connected to an input of an analog-to-digital converter.

11. Arrangement as claimed in claim 6, characterized in that the predistortion circuit is adaptive and therefore comprises an adaptation circuit which continuously adapts the predistortion circuit in response to a comparison of the input data and the transmitted data, by means of a demodulation of the transmitted data stream.

12. Arrangement as claimed in claim 10, characterized in that the predistortion circuit is adaptive and therefore comprises an adaptation circuit which continuously adapts the predistortion circuit in response to a comparison of the input data and the transmitted data, by means of a demodulation of the transmitted data stream.

* * * * *